(12) United States Patent
Nishihara et al.

(10) Patent No.: US 9,202,830 B2
(45) Date of Patent: Dec. 1, 2015

(54) IMAGING ELEMENT AND CAMERA SYSTEM EMPLOYING A HIGH-CONCENTRATION LAYER BETWEEN A PHOTODIODE AND AN INSULATION LAYER, WITH THE INSULATION LAYER BEING BETWEEN THE HIGH-CONCENTRATION LAYER AND A WELL OF AN AMPLIFYING TRANSISTOR

(75) Inventors: Toshiyuki Nishihara, Kanagawa (JP); Hirofumi Sumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 205 days.

(21) Appl. No.: 12/926,345

(22) Filed: Nov. 12, 2010

(65) Prior Publication Data
US 2011/0134264 A1 Jun. 9, 2011

(30) Foreign Application Priority Data
Dec. 3, 2009 (JP) .................................. 2009-275332

(51) Int. Cl.
*H04N 3/14* (2006.01)
*H04N 5/335* (2011.01)
*H01L 27/146* (2006.01)

(52) U.S. Cl.
CPC ...... *H01L 27/14609* (2013.01); *H01L 27/1463* (2013.01); *H01L 27/14689* (2013.01)

(58) Field of Classification Search
CPC ............ H01L 27/146; H01L 27/14612; H01L 27/14616; H01L 27/14645; H01L 27/14647; H04N 5/228

USPC ........................................... 348/294; 257/223
See application file for complete search history.

(56) References Cited

U.S. PATENT DOCUMENTS

| 4,611,223 | A | * | 9/1986 | Hine et al. ..................... 257/446 |
| 6,150,682 | A | | 11/2000 | Sawada et al. |
| 8,363,141 | B2 | * | 1/2013 | Shinohara ..................... 348/308 |
| 8,482,646 | B2 | * | 7/2013 | Watanabe et al. ............. 348/308 |
| 2002/0121655 | A1 | | 9/2002 | Zheng et al. |
| 2006/0022223 | A1 | * | 2/2006 | Kumesawa ................... 257/225 |
| 2006/0202242 | A1 | * | 9/2006 | Takagi et al. ................. 257/291 |
| 2006/0226438 | A1 | | 10/2006 | Katsuno et al. |
| 2010/0243866 | A1 | * | 9/2010 | Mo et al. .................. 250/214 A |
| 2012/0161267 | A1 | * | 6/2012 | Ezaki et al. ................... 257/431 |

FOREIGN PATENT DOCUMENTS

| CN | 101159281 A | 4/2008 |
| EP | 1 617 479 A2 | 1/2006 |

(Continued)

OTHER PUBLICATIONS

European Search Report issued May 6, 2013 for corresponding European Application No. 10192357.1.

(Continued)

*Primary Examiner* — Gary C Vieaux
(74) *Attorney, Agent, or Firm* — Michael Best & Friedrich LLP

(57) ABSTRACT

An imaging element includes an amplifying transistor. A signal charge from the photodiode is transferable to the gate of amplifying transistor, the photodiode being within a semiconductor substrate. The source and drain of the amplifying transistor are electrically isolated from a semiconductor substrate, wherein the source is within a well or the source and drain are within a silicon-on-insulator layer.

39 Claims, 15 Drawing Sheets

(56) References Cited

FOREIGN PATENT DOCUMENTS

| | | |
|---|---|---|
| GB | 2 332 049 A | 6/1999 |
| JP | 06-029762 | 2/1994 |
| JP | 06-151734 | 5/1994 |
| JP | 07-067043 | 3/1995 |
| JP | 2006-024787 A | 1/2006 |
| JP | 2007-088304 A | 4/2007 |
| WO | WO-00/21280 A1 | 4/2000 |

OTHER PUBLICATIONS

Japanese Office Action issued Nov. 19, 2013 for corresponding Japanese Application No. 2009-275332.

Chinese Office Action issued Nov. 27, 2014 for corresponding Chinese Application No. 201310015512.0.

\* cited by examiner

CIRCUIT CONFIGURATION EXAMPLE OF
A PIXEL HAVING AN AMPLIFIER

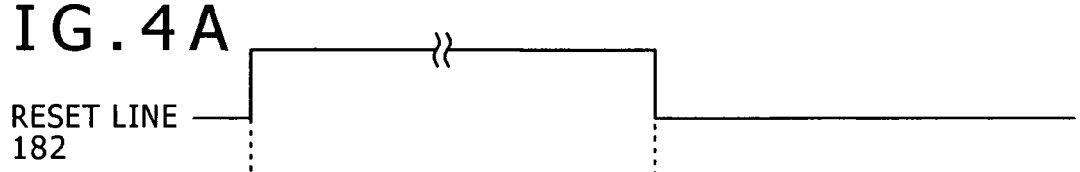
FIG.4A
RESET LINE
182
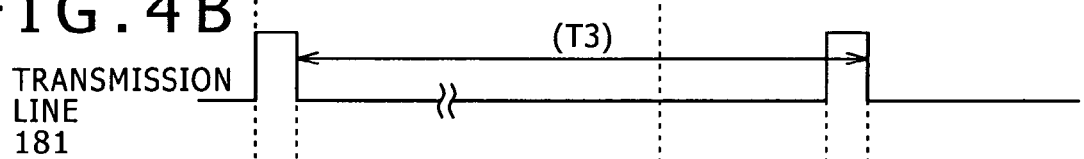
FIG.4B
TRANSMISSION
LINE
181
FIG.4C
FD NODE
116
FIG.4D
SOURCE
114S
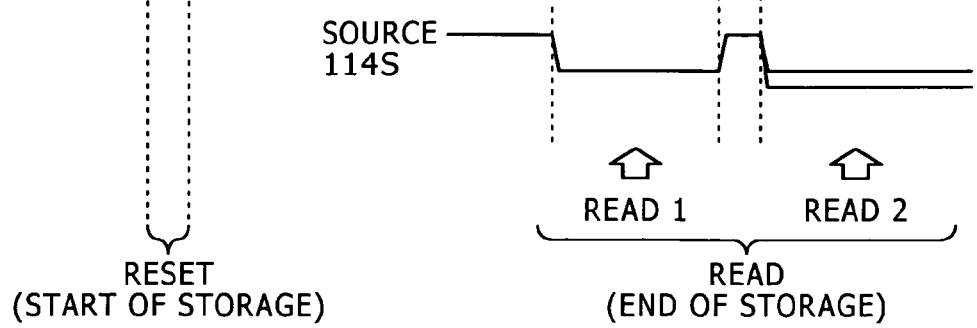

FIG.10
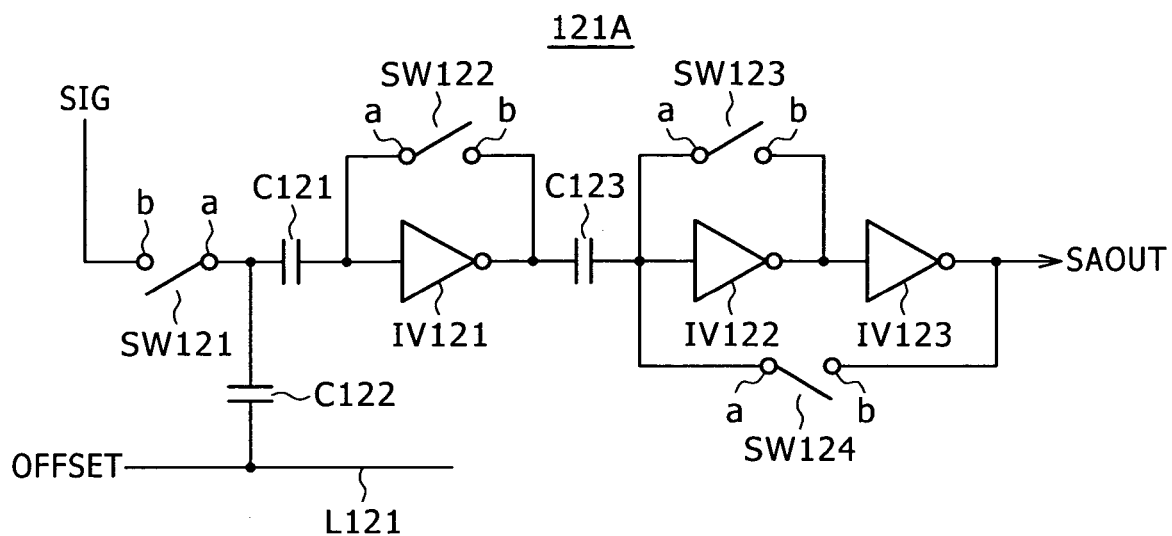
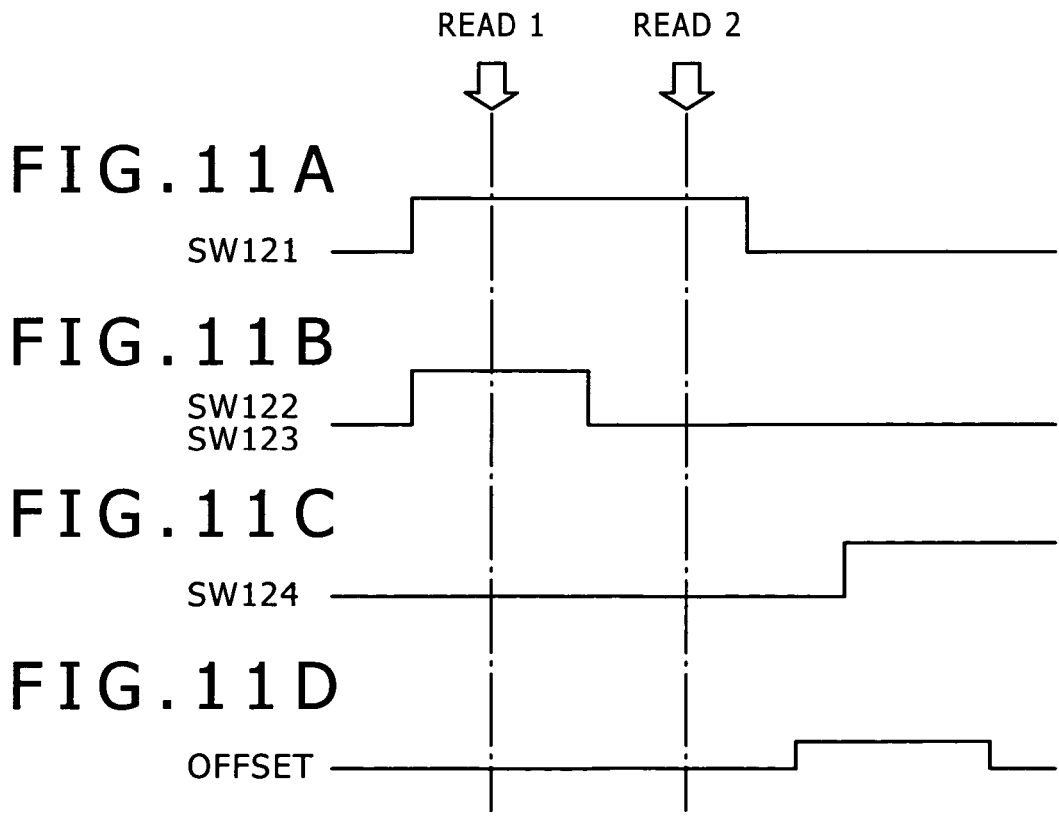

IMAGING ELEMENT AND CAMERA SYSTEM EMPLOYING A HIGH-CONCENTRATION LAYER BETWEEN A PHOTODIODE AND AN INSULATION LAYER, WITH THE INSULATION LAYER BEING BETWEEN THE HIGH-CONCENTRATION LAYER AND A WELL OF AN AMPLIFYING TRANSISTOR

The present application contains subject matter related to that disclosed in Japanese Priority Patent Application JP 2009-275332 filed in the Japan Patent Office on Dec. 3, 2009, the entire content of which is hereby incorporated by reference.

BACKGROUND OF THE INVENTION

1. Field of the Invention

The present invention relates to an imaging element such as CMOS (Complementary Metal Oxide Semiconductor) image sensor and a camera system.

2. Description of the Related Art

In recent years, vigorous measurement and imaging microscopic light and fluorescence emitted from biological bodies have been conducted in the fields of medicine and biotechnology.

Such imaging requires far higher sensitivity and lower noise than available ordinary imagers. An EM-CCD (Electron-Multiplying Charge-Coupled Device) is, for example, used that is capable of multiplying analog charge.

In the meanwhile, Japanese Patent Laid-Open No. 1995-67043 proposes an imaging element using time division photon counting.

This technique is designed to determine the presence or absence of a photon incident upon a photodiode for each given period as a binary value and compile the results obtained by repeating this process a plurality of times to obtain two-dimensional imaging data.

That is, this imaging element senses a signal from the photodiode every given period. So long as one or more photons are incident during that period, the counter connected to each of pixels is incremented by one irrespective of the number of incident photons.

When the frequency of incidence of photons upon the photodiode is random along the time axis, the actual number of incident photons and the count are consistent with the Poisson distribution. Therefore, when the frequency of incidence of photons is low, the actual number of incident photons and the count are in an approximately linear relationship. On the other hand, when the frequency of incidence of photons is high, the relationship can be corrected in an across-the-board manner.

Such an imaging element is particularly suited for imaging microscopic light thanks to its capability to completely eliminate read noise.

Such photon counting is generally implemented by charge multiplication.

For example, Japanese Patent Laid-Open No. 1995-67043 assumes that an avalanche diode is used to multiply the charge. An avalanche diode converts a photon incident upon the photo-receiving surface into a photoelectron and further accelerates the photoelectron across a high voltage to repeat the generation of secondary electrons by collision, thus multiplying the signal charge.

This provides a signal whose level is sufficiently large for detection of an incident photon.

An imaging element using photon counting is hardly subject to variations in sensitivity from one device to another. Therefore, an imaging surface can be formed by arranging such imaging elements.

Such an imaging element is expected to be used in a variety of applications including ultra-low exposure X-ray radiography by using it in combination with a scintillator.

SUMMARY OF THE INVENTION

Incidentally, normally accomplished by electron acceleration, charge multiplication requires an extremely high voltage, thus requiring a special process in semiconductor manufacturing.

Further, if charge multiplication is performed for each pixel with, for example, an avalanche diode, using a high voltage makes it difficult to electrically isolate a pixel from its adjacent pixels. As a result, this technique is disadvantageous in miniaturizing the pixels.

On the other hand, the multiplication of an analog signal during transfer leads in itself to new noise. This also leads to significantly large variations between devices.

A possible solution to the above problem would be to provide an amplifier in each pixel rather than multiplying the charge so that a signal of large level can be obtained from a single photoelectron by reducing the input capacitance of the amplifier to the utmost extent possible.

FIG. 1 is a diagram illustrating a circuit configuration example of a pixel having an amplifier.

A unit pixel circuit PX1 includes a photodiode 1, transfer transistor 2, reset transistor 3, amplifying transistor 4, storage node 5 and floating diffusion (FD) node 6.

The transfer transistor 2 has its gate electrode connected to a transfer line 7, and the reset transistor 3 has its gate electrode connected to a reset line 8. The amplifying transistor 4 has its gate electrode connected to the FD node 6.

In the pixel circuit PX1, light incident upon the silicon substrate of the pixel generates electron-hole pairs. The electrons in these pairs are stored in the storage node 5 by the photodiode 1.

The electrons are transferred to the FD node 6 as the transfer transistor 2 is turned on at a given timing, thus driving the gate of the amplifying transistor 4.

This allows for the signal charge to be read as a signal to a pixel output 9 that is the source of the amplifying transistor 4. The pixel output 9 acts as a source follower when grounded via a constant-current circuit or resistive element (not shown).

When turned on concurrently and in parallel with the transfer transistor 2, the reset transistor 3 extracts the electrons from the photodiode 1 and injects them into the power source, thus resetting the pixel to a dark state before the storage of electrons, i.e., a state with no incident photons.

In order to reduce the capacitance of the FD node 6, it has been a common practice to reduce the capacitance of the diffusion layer of the FD node 6, or the capacitance of the wire connecting the diffusion layer of the transfer transistor and the gate of the amplifying transistor 4 thanks to new ideas introduced into the layout and manufacturing steps.

However, these capacitance reductions alone fail to achieve dramatic effects and are not enough to permit detection of a single photoelectron.

The capacitance of the FD node includes the wire capacitance and diffusion layer capacitance as described earlier.

However, assuming that these capacitances are reduced by new ideas introduced into the layout and the progress of the semiconductor micropatterning techniques, what finally remains is the gate capacitance of the amplifying transistor 4 itself. This capacitance accounts for the majority of the parasitic capacitance of the FD node.

The more the amplifying transistor is reduced in size, the greater the output random noise becomes, thus limiting the extent to which this portion can be miniaturized.

The present invention provides an imaging element and camera system that can drastically reduce the effective gate capacitance of an amplifying transistor without changing the gate area thereof for significantly reduced overall parasitic capacitance.

An imaging element includes an amplifying transistor. A signal charge from the photodiode is transferable to the gate of amplifying transistor, the photodiode being within a semiconductor substrate. The source and drain of the amplifying transistor are electrically isolated from a semiconductor substrate, wherein the source is within a well or the source and drain are within a silicon-on-insulator layer.

The present invention provides drastically reduced gate capacitance of an amplifying transistor without changing the gate area thereof for significantly reduced overall parasitic capacitance.

BRIEF DESCRIPTION OF THE DRAWINGS

FIGS. 4A to 4D are timing charts for resetting, storing charge in and reading charge from the pixel circuit shown in FIG. 3;

FIG. 10 is a circuit diagram illustrating an example of a sensing circuit having a self-referencing capability;

FIGS. 11A to 11D are timing charts for describing an example of read operation using the sensing circuit having the self-referencing capability shown in FIG. 10 by taking, as an example, the pixel shown in FIG. 3;

DETAILED DESCRIPTION OF THE PREFERRED EMBODIMENTS

Figure 1:
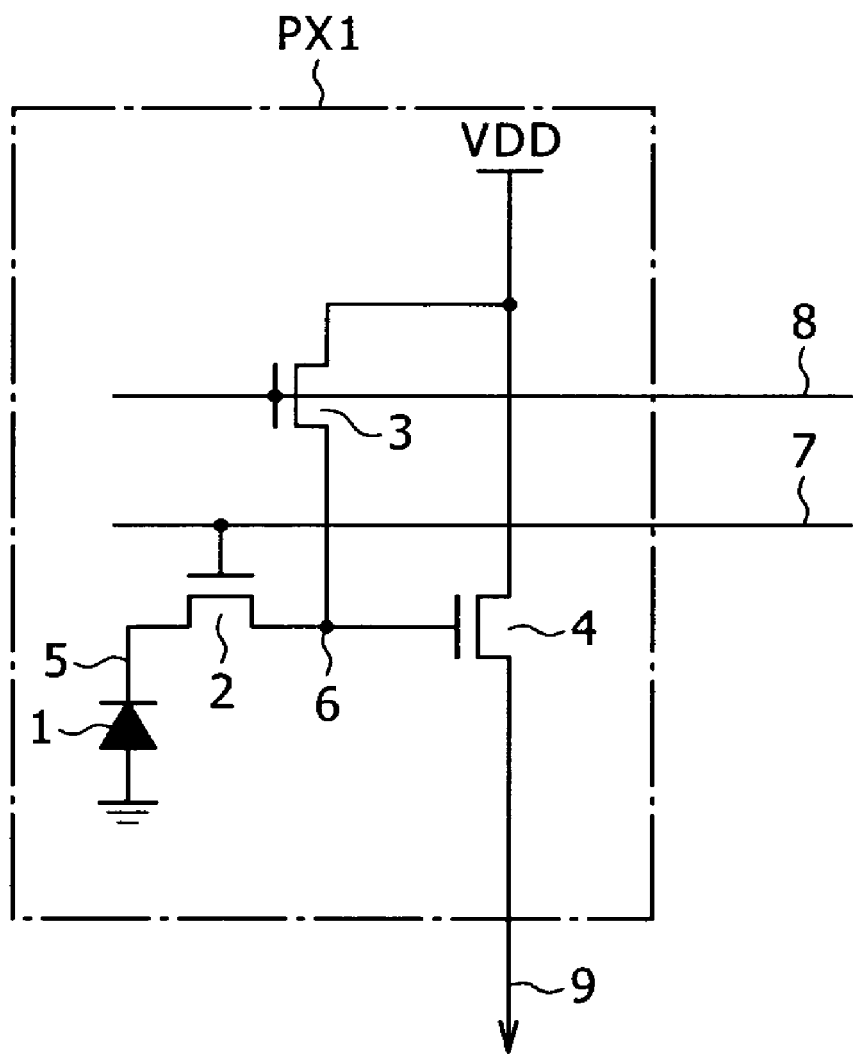
FIG. 1 is a diagram illustrating a circuit configuration example of a pixel having an amplifier.

A description will be given below of the embodiments of the present invention with reference to the accompanying drawings.

It should be noted that the description will be given in the following order:

1. Outline of the features of the imaging element according to the present embodiments
2. First embodiment (first configuration example of the imaging element)
3. Second embodiment (second configuration example of the imaging element)
4. Third embodiment (third configuration example of the imaging element)
5. Fourth embodiment (fourth configuration example of the imaging element)
6. Fifth embodiment (camera system)

<1. Outline of the Features of the Imaging Element According to the Present Embodiments>

In the present embodiments, the optimal configuration of an imaging element (CMOS image sensor) as a full digital image sensor using photon counting is materialized with a view toward achieving fast parallel read.

First, each pixel outputs the presence or absence of an incident photon during a specific period as an electric signal. The sensing circuit receives the result thereof a plurality of times within a frame period and determines each result as one of two binary values. The imaging element compiles the results to generate, for example, gray level data for each pixel.

Based on this basic configuration, the imaging element according to the present embodiments has the characteristic configurations described below.

The imaging element according to the present embodiments has a configuration that permits drastic reduction of the gate capacitance of the amplifying transistor formed with a field-effect transistor (FET) without changing the gate area thereof based on the constituent components of the FD node capacitance of the pixel.

In the present embodiments, the following embodiments are implemented by focusing attention on the fact that this capacitance is dependent upon the gain of the source follower and the behavior of the substrates.

In a first embodiment, the source follower output and amplifying transistor substrate are connected in a pixel using a buried photodiode, thus suppressing the substrate bias effect and bringing the gain closer to one. Then, the potentials of the amplifying transistor gate and substrate are modulated together.

This ensures effective drastic reduction of the gate capacitance of the amplifying transistor.

Further, a circuit is materialized in the first embodiment that keeps the increase in area to a minimum while at the same time taking on the above configuration.

In a second embodiment, the amplifying transistor has an SOI (silicon-on-insulator) structure in a pixel using a buried photodiode, thus bringing the substrate thereof into a floating state.

In such a structure, the substrate is completely depleted. As a result, the potential thereof is modulated as with that of the source.

At the same time, the substrate bias effect is suppressed, bringing the gain closer to one. The gate capacitance of the amplifying transistor can be effectively drastically reduced based on the same principle.

The present embodiments having the above configuration contribute to drastically reduced input capacitance of the amplifying transistor of the pixel, thus providing detectable pixel output even with a single photon.

This makes it possible to implement an imager using time division photon counting, thus allowing for imaging of a microscopic light beam and large-scale imaging with a plurality of imagers arranged side by side.

Moreover, the increase in area occupied by a group of circuits excluding the photodiode is kept to a minimum thanks to the optimal circuit configuration, thus maintaining the aperture ratio high.

Further, the present invention can provide significantly improved sensitivity even when applied to a common CMOS imager.

A detailed description will be given below of a CMOS image sensor, i.e., an imaging element according to the present embodiments having the above features.

<2. First Embodiment>

Figure 2:
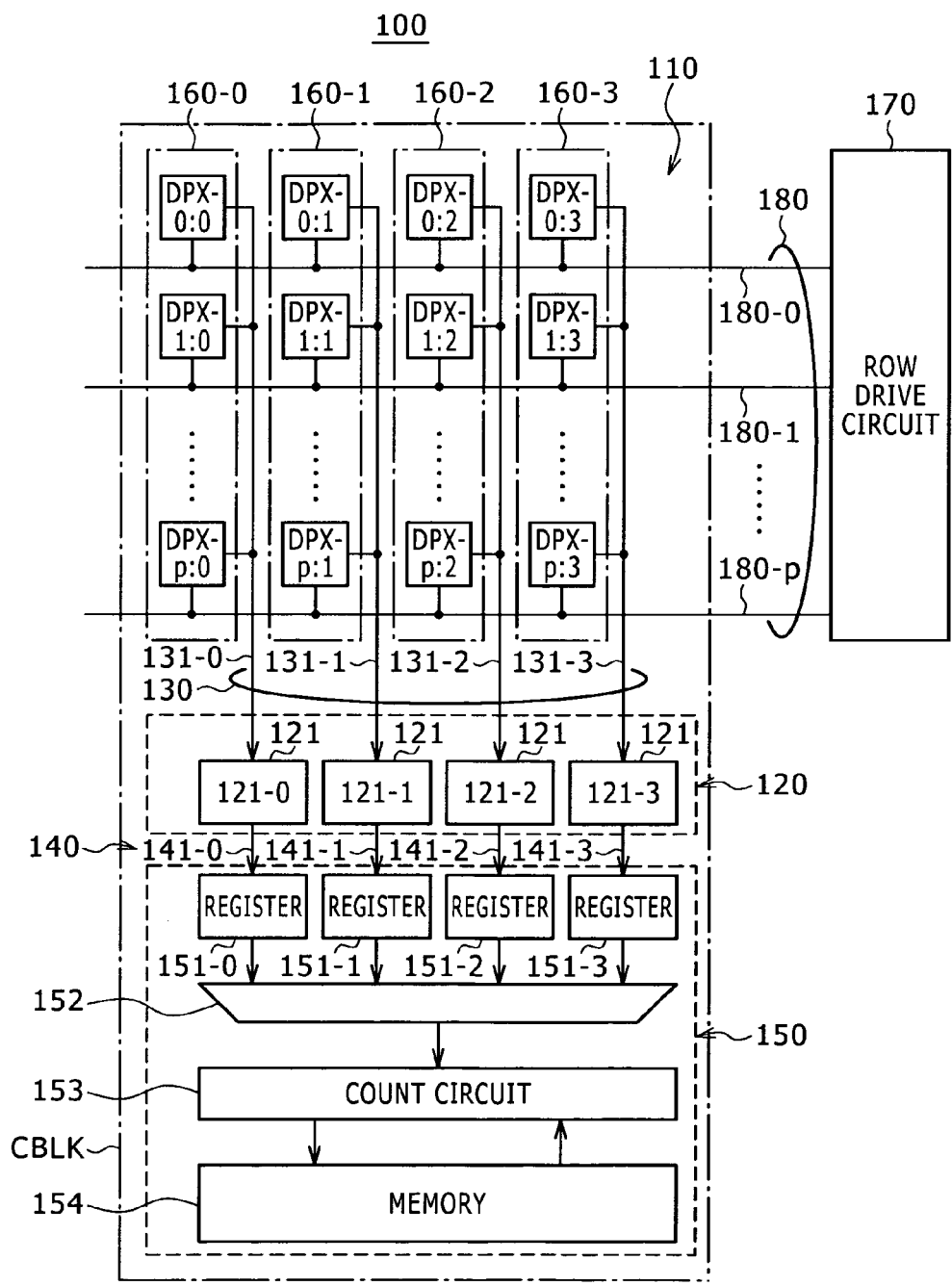
FIG. 2 is a diagram illustrating a configuration example of a CMOS image sensor (imaging element) according to a first embodiment of the present invention.

FIG. 2 is a diagram illustrating a configuration example of a CMOS image sensor (imaging element) according to a first embodiment of the present invention.

[Outline of the Overall Configuration]

A present CMOS image sensor 100 includes a pixel array section 110, sensing circuit section 120, output signal line group 130, transfer line group 140 and determination result compilation circuit section 150.

In the present CMOS image sensor 100, one sensing circuit is shared among a plurality of pixels as described later.

Therefore, pixel blocks 160 are formed in the present CMOS image sensor 100, each with a plurality of pixels DPX in the same column connected by an output signal line 131 to a select circuit 121. Although pixel blocks 160-0 to 160-3 are depicted within FIG. 2, additional pixel blocks 160 can be present within the pixel array section 110.

Further, the CMOS image sensor 100 includes a row drive circuit 170 and row control line group 180 adapted to drive the pixels DPX of the pixel array section 110 so that electric signals are output from the pixels DPX to output signal lines 131.

In the pixel array section 110, the plurality of digital pixels DPX are arranged in a matrix form of rows and columns.

Each of the digital pixels DPX has a photoelectric conversion element and is capable of outputting an electric signal in response to an incident photon.

Then, the pixel blocks 160 are formed, each with the plurality of pixels DPX in the same column and a select circuit, as described earlier.

The CMOS image sensor 100 includes a circuit block CBLK. The same block CBLK determines an electric signal transmitted through each of the output signal lines 131 as a binary value every given period and compiles the results for each pixel a plurality of times to generate two-dimensional imaging data.

The CMOS image sensor 100 compiles the determination results a plurality of times for a plurality of pixels, and for each of the plurality of pixel blocks 160 in the present embodiments, thus deriving the number of photons incident upon the pixel array section 110 serving as a photo-receiving section.

The CMOS image sensor 100 is further capable of expanding the dynamic range of photon counting by adding up the counting results of the plurality of pixels.

The pixel array section 110, sensing circuit section 120 and determination result compilation circuit section 150 are arranged in the circuit block CBLK.

The sensing circuit section 120 includes sensing circuits 121. A sensing circuit 121 of the sensing circuit section 120 is associated with a pixel block 160. Although sensing circuits 121-0 to 121-3 are depicted within FIG. 2, additional sensing circuits 121 being within the sensing circuit section 120 are within the scope of the invention.

As shown within FIG. 2, the sensing circuit 121-0 has its input connected to the output signal line 131-0 to which the outputs of all the pixels making up the pixel block 160-0, i.e., the pixels DPX-0:0 to DPX-p:0, are connected.

That is, the pixels DPX-0:0 to DPX-p:0 share the single sensing circuit 121-0.

It should be noted that a predetermined number of pixels DPX are in each of the pixel blocks 160 is set, for example, to 128. In this case, p is any of 0 to 127, and the pixel block 160-0 includes the pixels DPX-0:0 to DPX-127:0.

The sensing circuit 121-1 has its input connected to the output signal line 131-1 to which the outputs of all the pixels making up the pixel block 160-1, i.e., the pixels DPX-0:1 to DPX-p:1, are connected.

That is, the pixels DPX-0:1 to DPX-p:1 share the single sensing circuit 121-1.

The pixel block 160-1 includes, for example, 128 pixels DPX-0:1 to DPX-127:1.

The sensing circuit 121-2 has its input connected to the output signal line 131-2 to which the outputs of all the pixels making up the pixel block 160-2, i.e., the pixels DPX-0:2 to DPX-p:2, are connected.

That is, the pixels DPX-0:2 to DPX-p:2 share the single sensing circuit 121-2.

The pixel block 160-2 includes, for example, 128 pixels DPX-0:2 to DPX-127:2.

The sensing circuit 121-3 has its input connected to the output signal line 131-3 to which the outputs of all the pixels making up the pixel block 160-3, i.e., the pixels DPX-0:3 to DPX-p:3, are connected.

That is, the pixels DPX-0:3 to DPX-p:3 share the single sensing circuit 121-3.

The pixel block 160-3 includes, for example, 128 pixels DPX-0:3 to DPX-127:3.

In the sensing circuit section 120, sensing circuits are arranged so that a plurality of pixels share a sensing circuit in other pixel blocks (not shown).

The determination result compilation circuit section 150 is capable of compiling the determination results of the sensing circuits 121-0 to 121-3 a plurality of times to generate, for example, two-dimensional imaging data having a gray level. Alternatively, the determination result compilation circuit section 150 adds up the counting results of the plurality of pixels, thus allowing for imaging with a wide dynamic range by treating the group of these pixels as a unit photo-receiving surface. That is, the determination result compilation circuit section 150 is capable of deriving the number of photons incident upon the pixel array section 110 serving as a photo-receiving section by compiling the determination results a plurality of times for a plurality of pixels, and for each of the plurality of pixel blocks 160-0 to 160-3 and more in the present embodiments.

The determination result compilation circuit section 150 includes registers 151-0 to 151-3, select circuit 152, count circuit 153 and memory 154.

The registers 151-0 to 151-3 hold determination values of the sensing circuits 121-0 to 121-3 transferred through transfer lines 141-0 to 141-3.

The select circuit 152 sequentially selects the outputs of the registers 151-0 to 151-3 to supply the determination values, held by the registers 151-0 to 151-3, to the count circuit 153.

The count circuit 153 counts the determination values of the plurality of pixels (four pixels in this example) that are read through row-by-row selection and transferred via the select circuit 152, storing the counting results for each pixel in the memory 154.

Alternatively, the count circuit 153 adds up the counting results of the plurality of pixels and stores the addition results in the memory 154.

The count circuit 153 loads the previously read pixel data from the memory 154.

The determination result compilation circuit section 150 according to the present first embodiment includes the single count circuit 153 that is shared among a plurality of registers 152-0 to 152-3.

In other words, the count circuit 153 is shared among the plurality of sensing circuits 121-0 to 121-3 in the CMOS image sensor 100 according to the present first embodiment.

The CMOS image sensor 100 according to the present embodiment is configured to include the characteristic configurations described earlier.

That is, the CMOS image sensor 100 is configured so that each sensing circuit is shared among and cyclically accessed by a plurality of pixels, thus allowing for use of smaller pixels while at the same time securing exposure time.

Further, the CMOS image sensor 100 is configured so that the count circuit is shared among the plurality of sensing circuits, thus permitting flexible optimization between the circuit scale and processing speed.

Still further, the CMOS image sensor 100 is capable of expanding the dynamic range of photon counting by adding up the counting results of the plurality of pixels.

[Capabilities Relating to the Digital Pixel]

A description will be given here of a configuration example of the digital pixel DPX.

The digital pixels (hereinafter may be simply referred to as the pixel) DPX each have a photoelectric conversion element and output an electric signal in response to incidence of a photon.

The CMOS image sensor 100 as an imaging element is capable of not only resetting but also reading the pixels DPX. As a result, the same sensor 100 can reset and read the pixels DPX at arbitrary timings.

The pixels DPX are reset to a state with no incident photons. Each of the pixels DPX should preferably include a lens and, as necessary, a color filter on their photo-receiving surface.

Although these basic capabilities of the pixels are similar to those of ordinary pixels, their output need not be accurate or linear as an analog output should be.

A description will be given here of an example of a digital pixel configuration.

Figure 3:
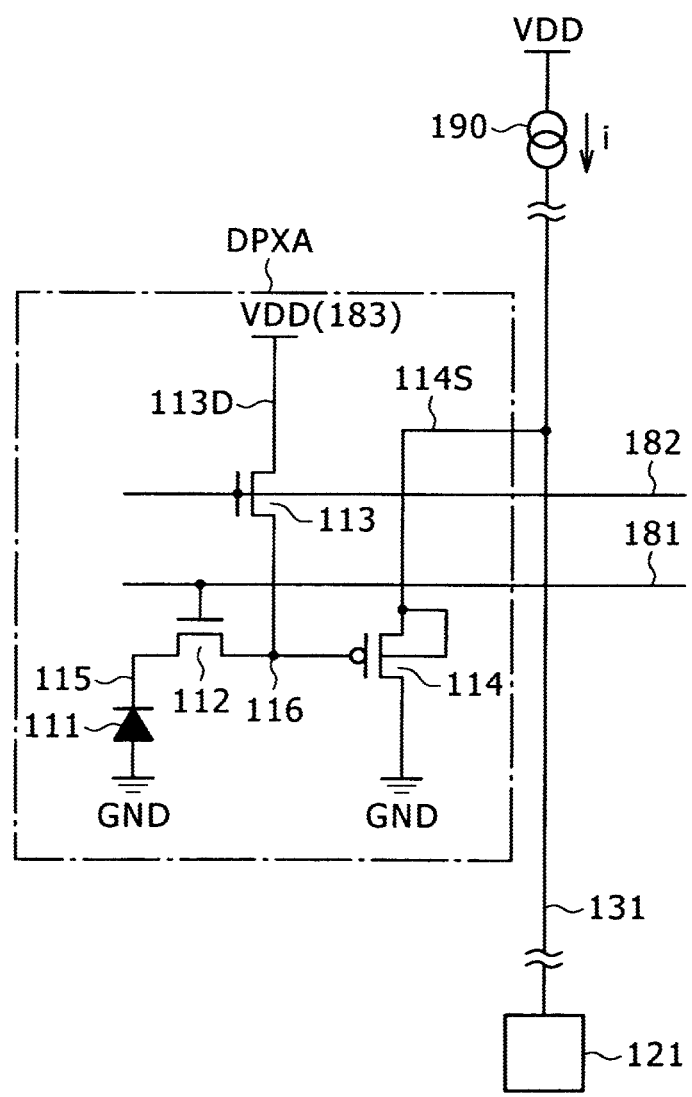
FIG. 3 is a diagram illustrating an example of a pixel circuit configuration according to the first embodiment.

FIG. 3 is a diagram illustrating an example of a pixel circuit configuration according to the first embodiment.

FIG. 3 illustrates an example of a pixel circuit in which the unit pixel DPX includes three transistors.

In the unit pixel according to the present first embodiment, the amplifying transistor is formed with a p-type FET (Field-Effect Transistor) (PMOS (Positive Channel Metal Oxide Semiconductor) transistor).

A unit pixel DPXA includes a photodiode 111, transfer NMOS transistor 112, reset NMOS transistor 113, amplifying PMOS transistor 114, storage node 115 and FD (Floating Diffusion) node 116.

The transfer NMOS (Negative Channel Metal Oxide Semiconductor) transistor 112 has its gate electrode connected to a transfer line 181 serving as a row control line. The reset NMOS transistor 113 has its gate electrode connected to a reset line 182 serving as a row control line.

The amplifying PMOS transistor 114 has its gate electrode connected to the FD node 116. An output signal line 131 is connected to the source 114S and the contact region 214 of the PMOS transistor 114.

In the present first embodiment, the amplifying PMOS transistor 114 has its source 114S connected through the contact region 214 to the n-Well 206. The amplifying PMOS transistor 114 has its drain 114D connected to a reference potential VSS (e.g., ground GND).

In a unit pixel DPX10, light incident upon the silicon substrate of the pixel generates electron-hole pairs. The electrons in these pairs are stored in the storage node 115 by the photodiode 111.

The electrons are transferred to the FD node 116 as the transfer NMOS transistor 112 is turned on at a given timing, thus driving the gate of the amplifying PMOS transistor 114.

On the other hand, the reset NMOS transistor 113 that has its drain connected to a source potential VDD is used to reset the pixel.

The amplifying PMOS transistor 114 has its drain 114D grounded and its source 114S connected through the contact region 214 to the n-Well 206. The source 114S is further connected to the output signal line 131.

The output signal line 131 is shared among the plurality of pixels arranged in the column direction. The output signal line 131 is connected to the power source via a constant-current circuit 190. This allows for the amplifying PMOS transistor 114 to act as a source follower.

That is, the signal charge transferred to the FD node 116 is output as a signal to the output signal line 131.

A specific description will be given below of storage of charge in and reading of charge from the pixel circuit according to the present embodiment.

FIGS. 4A to 4D are timing charts for resetting, storing charge in and reading charge from the pixel circuit shown in FIG. 3.

FIG. 4A illustrates a signal potential of the reset line 182, FIG. 4B that of the transfer line 181, FIG. 4C a potential of the FD node 116, and FIG. 4D that of the source 114S of the amplifying PMOS transistor 114.

Prior to storage of charge, the pixel is reset first.

When the pixel is reset, the reset line 182 and transfer line 181 are pulled up to high level. This turns on the reset NMOS transistor 113 and transfer NMOS transistor 112.

This operation transmits the source voltage of 1.8 V to the storage node 115.

As a result, the potential of the storage node 115 rises, causing the electrons stored therein to be extracted.

In a HAD (Hole-Accumulation Diode) structure in particular, the storage node 115 is formed with a thin n-type layer sandwiched between p-type layers. Its electrons are completely discharged, thus completely depleting the storage node 115.

Then, the transfer line 181 is pulled down to low level. This turns off the transfer NMOS transistor 112, bringing the storage node 115 into a floating state and initiating a new charge storage cycle.

During the charge storage, on the other hand, the reset line 182 is maintained at high level, holding on the reset NMOS transistors 113 of the unselected pixels.

As a result, the FD node 116 connected to the gate of the amplifying PMOS transistor 114 is maintained at the source voltage.

This maintains the amplifying PMOS transistors 114 of the unselected pixels off.

A description will be given next of reading of stored charge.

First, the reset line 182 in the selected row is pulled down to low level, turning off the reset NMOS transistors 113.

At this time, the FD node 116 is coupled to the gate of the reset NMOS transistors 113. This causes the FD node 116 to change in potential, for example, from 1.8 V to 0.8 V, bringing the same node 116 into a floating state. As a result, the amplifying PMOS transistors 114 turns on.

Here, the amplifying PMOS transistors 114 and the output signal line 131 connected to the constant-current circuit 190 make up a source follower circuit. A potential Vfd of the FD node 116 serving as the input of the source follower circuit and a potential Vsl of the output signal line 131 serving as the output of the output signal line 131 are in a close-to-linear relationship with a variation ratio close to one.

That is, letting the current of the constant-current circuit 190 be denoted by i, ideally the following equation holds:

$$i=(1/2)*\beta*(Vfd-Vth-Vsl)^2 \text{ //}\beta \text{ is a constant} \quad \text{[Equation 1]}$$

Here, (Vfd−Vth−Vsl) is constant. Therefore, the variation in the potential Vfd of the FD node 116 is reflected in the potential Vsl of the output signal line 131 with a gain close to one.

That is, when the amplifying PMOS transistors 114 turns on, the variation in potential of the FD node 116 is reflected in the variation in potential of the output signal line 131.

Here, the charge is read the first time (READ 1). The potential appearing on the output signal line 131 is temporarily held by the sensing circuit 121.

Next, the transfer line 181 is pulled up to high level, turning on the transfer NMOS transistor 112. As a result, the FD node 116 is coupled to the storage node 115, causing the potential of the FD node 116 to rise. This causes the electrons stored in the storage node 115 to flow into the FD node 116.

At this time, if the potential of the FD node 116 is sufficiently high, all the electrons stored in the storage node 115 flow into the FD node, thus completely depleting the storage node 115.

Then, the transfer line 181 is pulled down to low level, turning off the transfer NMOS transistor 112. As a result, the potential of the FD node 116 drops by the signal charge as compared to that before the transfer line was driven.

That is, in the absence of an incident photon, the potential of the FD node 116 drops back to around 0.8 V. However, if photoelectrons have been generated as a result of incidence of photons, the potential of the FD node 116 drops according to the number of photoelectrons. As a result, the potential drops, for example, to 0.7 V. This is reflected in the output signal line 131 serving as the output of the source follower.

Here, the charge is read the second time (READ 2). The signal held by the sensing circuit 121 is compared against the current read signal to determine the presence or absence of an incident photon.

The exposure period of each pixel is the period between the reset and read operations. More precisely, the exposure time begins when the transfer NMOS transistor 112 turns off after the reset operation and ends when the transfer NMOS transistor 112 turns on for the read operation (T3).

During this period, if charge develops as a result of incidence of a photon on the photodiode 111, this charge is detected by the sensing circuit 121 as the difference from the signal read the second time.

In the pixel configuration as described above, the n-Well 206 of the amplifying PMOS transistors 114 making up the source follower is connected to the source 114S of the amplifying transistors 114. This ensures that the substrate is free from substrate bias effect, thus bringing the gain closer to one.

At the same time, the potentials of the gate and substrate of the amplifying PMOS transistor 114 are modulated together, thus bringing the effective gate capacitance of the amplifying PMOS transistor 114 in the FD node 116 close to zero and contributing to significantly reduced overall parasitic capacitance thereof.

That is, the transfer of the slightest number of photoelectrons to the FD node 116 provides the pixel with a large output amplitude.

It should be noted that, in an ordinary source follower, the connection of the source output of the amplifying transistor to the substrate thereof in itself has been common practice to increase the output gain.

However, the connection is made in the present embodiment to reduce the FD node capacitance of the pixel to an utmost minimum so as to detect extremely microscopic charge, for example, as small as that of one photon.

In order to do so, the photodiode 111 having a large parasitic capacitance is not capacitance-coupled to the FD node 116.

More specifically, the photodiode 111 and FD node 116 are isolated by the transfer transistor 112. Further, the photodiode 111 is, for example, a buried photodiode as typified by a HAD structure.

In such a structure, the reset operation discharges all the electrons from the storage node 115 of the photodiode 111, thus completely depleting the storage node 115. As a result, the potential thereof rises, for example, only to 0.4 V.

The same is true during the read operation. When all the charge is transferred to the FD node 116 as a result of the transfer transistor 112 turning on, a potential difference is maintained between the photodiode 111 and FD node 116, thus preventing the two from being capacitance-coupled to each other.

The reduction of the FD node capacitance to an utmost minimum as described above leads to a large manufacturing variation in capacitance in itself.

Therefore, if the pixel output is treated as analog data, this variation translates as-is into a signal variation.

However, if the presence or absence of an incident photon for a specific period is determined as a binary value, and if these results are compiled to obtain an imaging gray level, the variation in the FD node capacitance is not reflected in the resultant signal so long as a signal level sufficient for determination is secured.

That is, the total pixel output directly reflects the incident photon count which will not vary due to manufacturing process.

In the example described above, the on/off operations of the amplifying transistor 114 are controlled by the coupling with the gate of the reset transistor 113.

Although this is effective for simplifying the wiring, the drain 113D of the reset transistor 113 may be, if necessary, driven as appropriate.

For example, when the pixel is not selected, the potential of the drain 113D may be raised, and that of the FD node 116 also raised to a higher level.

This completely prevents any leak current from the amplifying transistor 114 when the pixel is not selected, thus suppressing unwanted noise generated on the output signal line by the unselected pixel.

Figure 5:
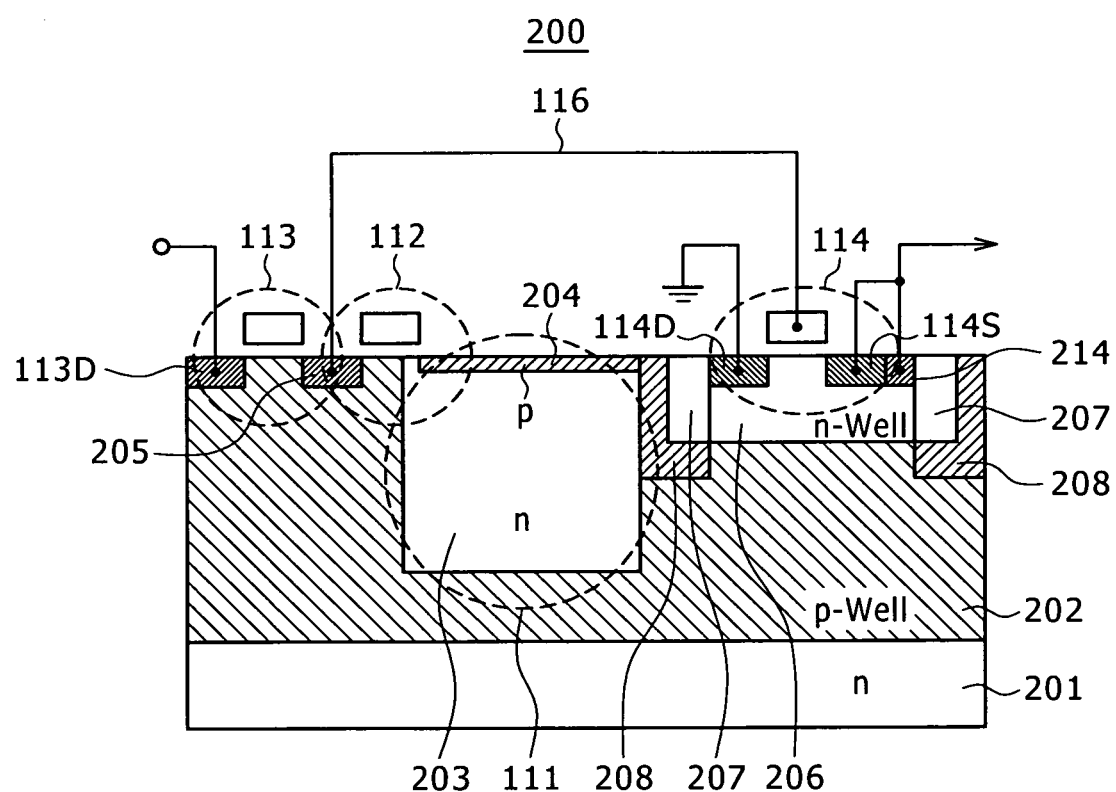
FIG. 5 is a diagram illustrating an example of sectional structure of the pixel circuit according to the first embodiment.

FIG. 5 is a diagram illustrating an example of sectional structure of the pixel circuit according to the first embodiment.

A pixel circuit 200 shown in FIG. 5 includes a thin n-type layer 201 epitaxially formed on a wafer. A p-Well region 202 for a pixel is formed on the n-type layer 201. The elements making up the pixel are formed in the p-Well region 202.

In the photodiode 111, a p-type layer 204 is formed on the surface of an n-type storage layer 203. As a result, the photodiode 111 is a so-called "buried photodiode" with its signal charge storage layer sandwiched between two layers of opposite conductivity types in the direction along the depth of the substrate.

In the present example, the photodiode 111 has a HAD structure in which the n-type storage layer 203 is sandwiched between the p-type layer 204 on the surface and the p-Well 202 of the substrate.

The transfer transistor 112 is an NMOS transistor using the p-Well 202 as its substrate. The transfer transistor 112 transfers the charge stored in the photodiode 111 to the gate of the amplifying transistor 114 and the FD node 116 that includes an n-type diffusion layer 205.

The amplifying transistor 114 is a PMOS transistor using an n-Well 206, formed in the p-Well 202, as its substrate.

The p-Well 202 is grounded whereas the n-Well 206 is forwardly biased at all times. Therefore, the two wells are electrically isolated from each other.

The amplifying transistor 114 has its drain 114D grounded and its source 114S connected to the n-Well 206. As a result, the source 114S forms a pixel output.

Further, the reset NMOS transistor 113 is formed in the pixel circuit 200. The reset NMOS transistor 113 uses the p-Well 202 as its substrate. The reset transistor 113 has its drain 113D connected to the power source or driven, as appropriate, by a peripheral circuit depending on whether or not the pixel is selected.

A buried oxide film 207 serves as an element-to-element isolation layer adapted to prevent signal leak between the n-Well 206 and the n-type storage layer 203 of the photodiode 111. The buried oxide film 207 is covered with a high-concentration p-type layer 208 on the bottom and side.

As described above, the photodiode 111 and transfer NMOS transistor 112 are formed using the p-Well 202 as a substrate.

Further, the amplifying PMOS transistor 114 is formed using the n-Well layer 206, provided in the p-Well 202, as a substrate.

The pixel structure as described above is designed to isolate the substrate of the amplifying transistor 114 from other elements with a minimum occupied area. This allows for connection between the source output and substrate of the amplifying transistor 114, thus contributing to significantly reduced effective parasitic capacitance of the FD node.

Figure 6:
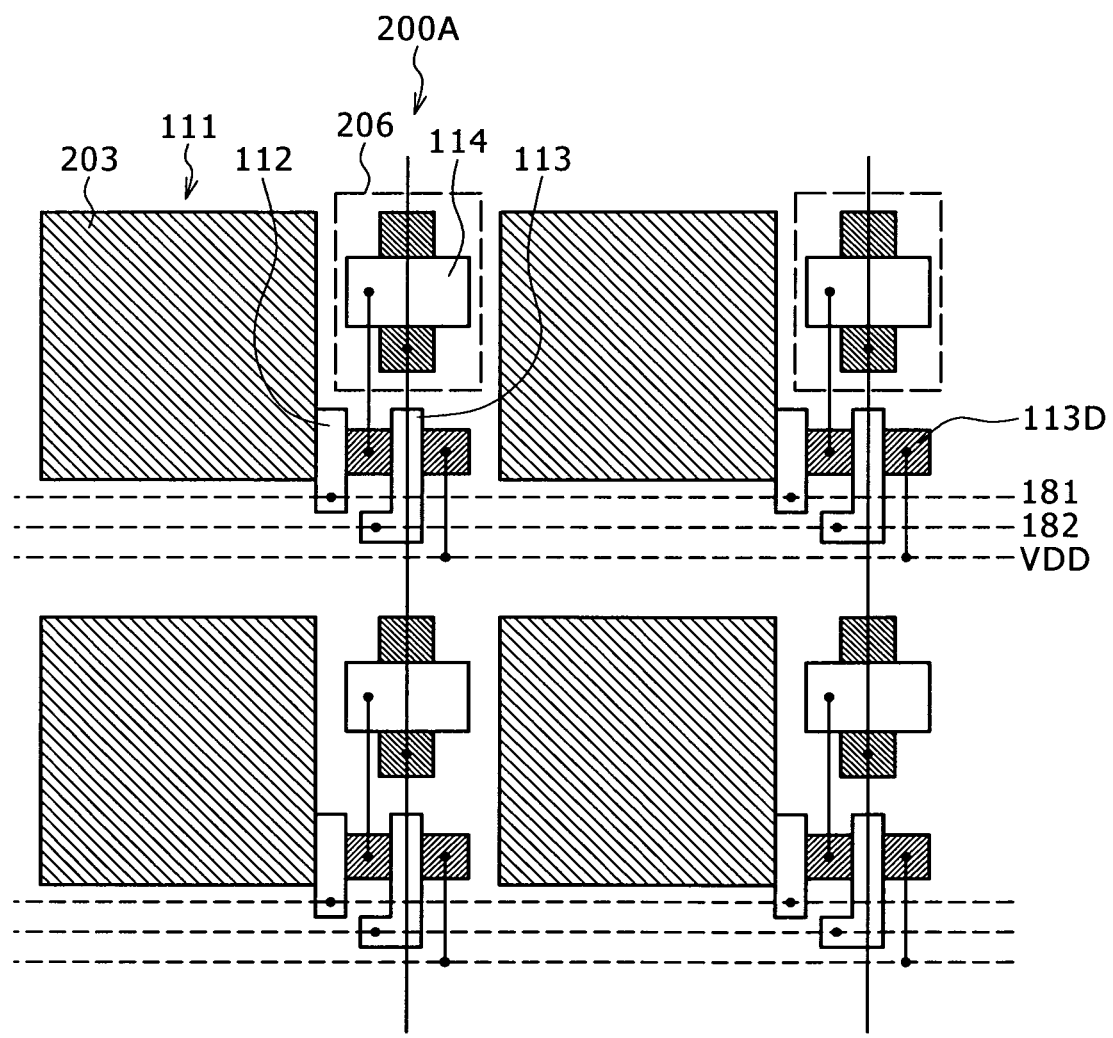
FIG. 6 is a diagram illustrating a layout example of a pixel section having the pixel circuit according to the first embodiment shown in FIGS. 3 and 4.

FIG. 6 is a diagram illustrating a layout example of a pixel section having the pixel circuit according to the first embodiment shown in FIGS. 3 and 4A to 4D.

Each of pixel circuits 200A includes the photodiode 111, transfer transistor 112, reset transistor 113 and amplifying transistor 114.

An active region of the amplifying transistor 114 is formed in the n-Well 206, thus electrically isolating the active region from the substrates of other elements.

A description will be given next of the manufacturing method of the pixel circuit according to the present first embodiment with reference to FIGS. 7A and 7B, 8A and 8B and 9.

In order to electrically isolate the amplifying transistor 114 from the photodiode 111 and transfer transistor 112, the element-to-element isolation buried diffusion layer 208 and trench isolation section/buried oxide film 207 are formed in the substrate.

Figure 7A:
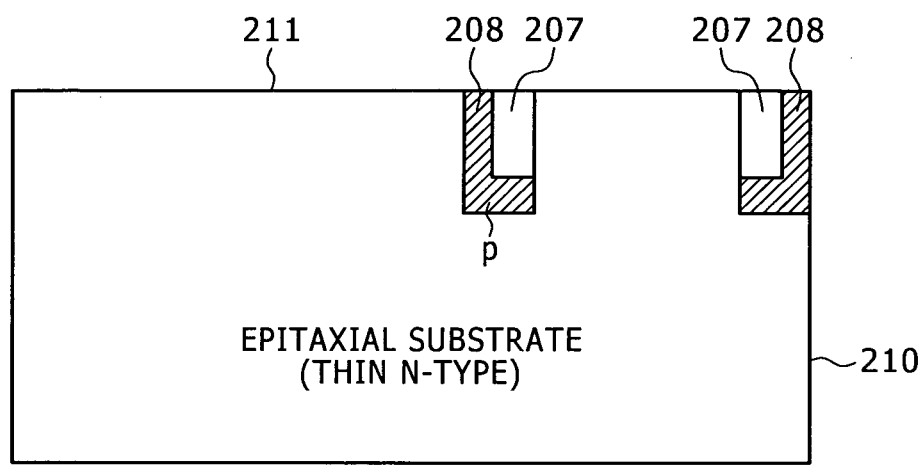
FIGS. 7A and 7B are first diagrams for describing the manufacturing method of the pixel circuit according to the first embodiment.

More specifically, as illustrated in FIG. 7A, the p-type element-to-element isolation buried diffusion layer 208 and trench isolation section/buried oxide film 207 are formed on the right edge in the figure on a main side 211 of a thin n-type epitaxial substrate 210.

Figure 7B:
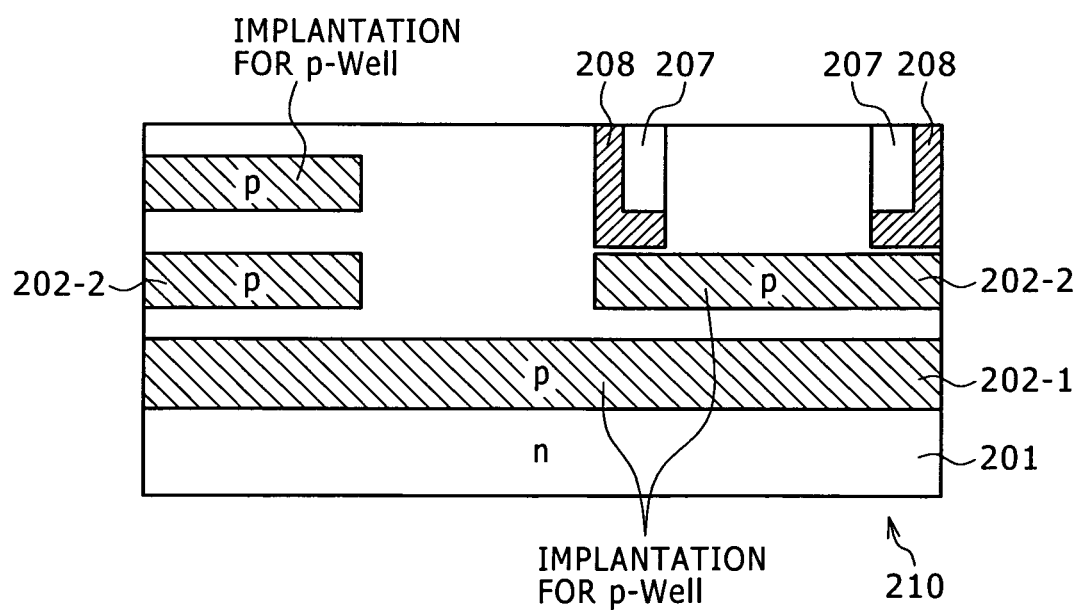

Next, as illustrated in FIG. 7B, boron for the p-Well 202 is injected (implanted) three times at different depths.

In the first implantation, boron is implanted deeply to form a bottom portion 202-1 of the p-Well 202.

In the second implantation, boron is implanted less deeply and selectively to form a peripheral portion p-Well 202-2 around the photodiode 111. At this time, no boron is injected in the region of the photodiode 111.

In the third implantation, boron is selectively implanted into the region near the surface of the main side 211 to form the p-Well 203. At this time, no boron is injected into the photodiode 111 or n-Well 206.

Figure 8A:
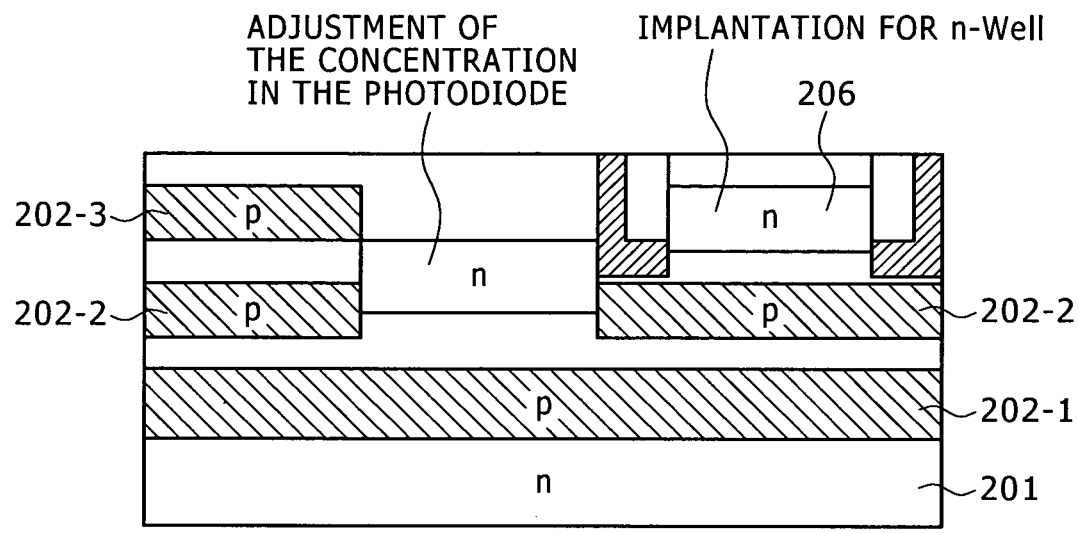
FIGS. 8A and 8B are second diagrams for describing the manufacturing method of the pixel circuit according to the first embodiment.

Next, as illustrated in FIG. 8A, phosphorus for the n-Well 206 is implanted into the region between the element-to-element isolation buried diffusion layer 208 and trench isolation section/buried oxide film 207.

Further, an n-type ion (phosphorus) for concentration adjustment is implanted into the region of the photodiode 111 as necessary.

Figure 8B:
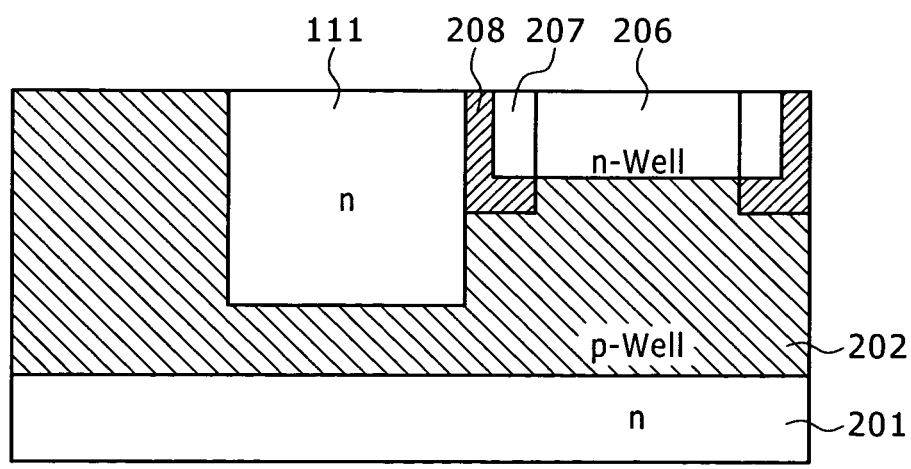

Next, as illustrated in FIG. 8B, the ions are diffused and activated by thermal treatment to form the p-Well 202, n-Well 206 and photodiode 111.

Figure 9:
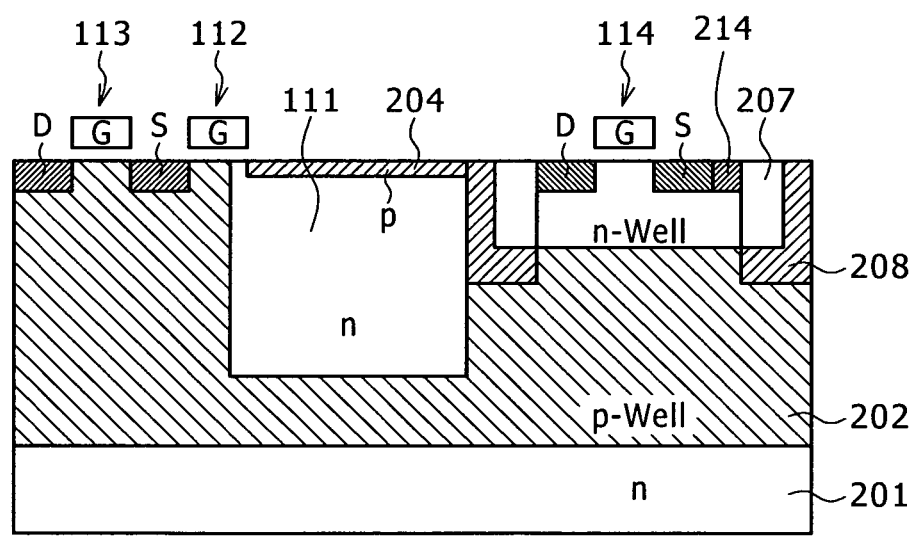
FIG. 9 is a third diagram for describing the manufacturing method of the pixel circuit according to the first embodiment.

Then, as illustrated in FIG. 9, the sources (S), drains (D) and gates (G) of the amplifying transistor 114, reset transistor 113 and transfer transistor 112 and the p-type diffusion layer for the HAD structure are formed as upper elements.

The pixel circuit according to the present embodiment is manufactured as described above.

A description will be given next of the general outline of the operation of the CMOS image sensor 100 according to the first embodiment.

As described earlier, each of the pixel blocks 160 (one of 160-0 to 160-3 and more) includes the 128 digital pixels DPX and a select circuit. The select circuit selects one of the 128 digital pixels DPX to proceed with the reset and read operations.

In the present example, one of the pixels in the pixel block 160 is selected according to the row control lines 181 and 182 driven by the row drive circuit 170.

During the read operation, the presence or absence of a photon incident upon the selected pixel is output as an electric signal to the output signal line 131 (131-0 to 131-0 and more) so that the signal is determined as a binary value. The sensing circuit 121 (121-0 to 121-3) confirms "1" in the presence of an incident photon and "0" in the absence thereof as a determination value and latches that value.

The determination value of the sensing circuit 121 (121-0 to 121-3) is transferred to the register 151 (151-0 to 151-3) first.

The count circuit 153 is shared among the four pixel blocks 160-0 to 160-3. The same circuit 153 sequentially counts, via the select circuit 152, the determination values that are read from the four pixels through row-by-row selection.

Then, the counting result for each of the pixels is stored in the memory 154.

That is, the previously read pixel data is loaded from the memory 154 into the count circuit 153.

Here, when "1" is stored in the register 151 (151-0 to 151-3), "1" is added to the count circuit 153. On the other hand, when "0" is stored in the register 151, the count value of the count circuit 153 is not updated.

Then, the value of the count circuit 153 is written back to the memory 154, thus completing the counting for one pixel. This process is sequentially repeated for the four pixels.

During the counting, the pixel block 160 (one of 160-0 to 160-3) and sensing circuit 121 (one of 121-0 to 121-3) can concurrently proceed with the reading and determination operations for the next row.

Such digital reading is conducted, for example, 1023 times per frame period, thus generating 10-bit gray level data for each pixel.

At this time, the count circuit 153 is 10-bit wide. On the other hand, the memory 154 is 512 bits wide because each of the (128 by 4) pixels has 10-bit data.

That is, the present CMOS image sensor 100 functions as a photocounter arrayed in a unique configuration.

If the dynamic range is expanded by adding up the counting results of the plurality of pixels, the following control is performed. For example, when an imaging unit includes four-by-four pixels, the pixel data in each of the imaging units is stored in the same address of the memory 154.

This allows for the counting values of incident photons for the 16 pixels to be added up in the count circuit 153 via the memory 154.

At this time, the total count increases 16-fold. As a result, the count circuit 153 requires 14 bits.

On the other hand, the number of addresses of the memory 154 is reduced to one sixteenth or 32, with each address storing a 14-bit value. Therefore, the memory 154 requires 448 bits in total.

Alternatively, if only the total number of photons incident upon the entire photo-receiving surface is counted, a memory is not necessarily required because the count circuit 153 need only hold the data.

In this case, the counter requires 19 bits to handle 10-bit data for 512 pixels. Thus, the required sizes of the count circuit 153 and memory 154 vary depending on the application.

Alternatively, if capabilities ranging from two-dimensional imaging of all pixels to addition of all pixels are switched according to the application, the count circuit 153 should be 14-bit wide, with 14 bits made available in the memory 154 for each of the (128 by 4) pixels. Further, the circuit block CBLK should be able to handle addition of up to four by four pixels.

In order to add up all the pixels, the circuit block CBLK need only add four by four pixels first, with a separate adder provided in the output circuit so that the adder sums the plurality of output values from the memory 154. In this case, the adder in the output section need only have one sixteenth the processing capability required when no advance additions are made, thus requiring no high-speed processing.

Incidentally, when data is read from the digital pixels used in the present embodiment, the self-referencing capability should preferably be used during sensing so as to cancel the variations in output from one pixel to another.

For example, when data is read from the pixels, a sensing circuit as shown in FIG. 10 should be used to detect the presence or absence of difference between two pieces of read data shown in FIG. 4 so as to determine the presence or absence of a single incident photon.

FIG. 10 is a circuit diagram illustrating an example of a sensing circuit having a self-referencing capability.

A sensing circuit 121A illustrated in FIG. 10 includes switches SW121, SW122, SW123 and SW124, capacitors C121, C122 and C123, inverters IV121, IV122 and IV123 and a supply line L121 of an offset signal OFFSET.

The switch SW121 has its terminal 'a' connected to the first terminals of the capacitors C121 and C122 and has its terminal 'b' connected to a terminal SIG that is connected to the output signal line.

The capacitor C121 has its second terminal connected to the input terminal of the inverter IV121 and the terminal 'a' of the switch SW122.

The capacitor C122 has its second terminal connected to the supply line L121 of the offset signal OFFSET.

The inverter IV121 has its output terminal connected to the first terminal of the capacitor C123 and the terminal 'b' of the switch SW122.

The capacitor C123 has its second terminal connected to the input terminal of the inverter IV122 and the terminals 'a' of the switches SW123 and SW124.

The inverter IV122 has its output terminal connected to the input terminal of the inverter IV123 and the terminal 'b' of the switch SW123.

The inverter IV123 has its output terminal connected to the terminal 'b' of the switch SW124 and an output terminal SAOUT.

A description will be given here of a read operation using the sensing circuit having the self-referencing function illustrated in FIG. 10 by taking, as an example, the pixel shown in FIG. 3.

FIGS. 11A to 11D are timing charts for describing an example of read operation using the sensing circuit having the self-referencing capability shown in FIG. 10 by taking, as an example, the pixel shown in FIG. 3.

FIG. 11A illustrates the on/off status of the switch SW121, FIG. 11B the on/off statuses of the switches SW122 and SW123, FIG. 11C the on/off status of the switch SW124, and FIG. 11D the offset signal OFFSET.

First, the switches SW121, SW122 and SW123 are turned on, after which the first read signal is fed to the input terminal SIG.

Next, the switches SW122 and SW123 are turned off to hold the signal level.

Next, the second read signal is fed to the input terminal SIG, after which the switch SW121 is turned off.

During this period, the offset signal OFFSET is maintained at 0 V.

Next, the offset signal OFFSET is raised slightly in potential, thus adding the offset potential to the read signal via the capacitor C122.

This allows for comparison between the output in the reset state and that obtained when a slight offset is added to the read signal.

In the presence of a photon incident upon the pixel shown in FIG. 3, the second read signal is lower in potential than the first one, causing "1" to be output to the output terminal SAOUT.

In the absence of a photon incident upon the pixel, the second read signal is higher in potential than the first one, causing "0" to be output to the output terminal SAOUT.

Finally, the switch SW124 turned on to latch the determination result.

As described above, the self-referencing sensing cancels the fixed noise in each pixel caused by variations in threshold in the amplifying transistor of each pixel, thus allowing for accurate determination of a signal as a binary value even when the signal is extremely small in level. Further, the above sequence cancels the reset kTC noise.

The circuit is not limited to these examples. Instead, the reset signal added with an offset may be read and compared against the read signal for determination.

It should be noted that the above sensing circuit example assumes time division photon counting by detecting a single photon.

However, the pixel configuration according to the embodiments of the present invention is also applicable to an ordinary image sensor designed to treat a pixel output as an analog signal. In this case, a significantly high sensitivity can be achieved.

An ordinary image sensor must detect the difference between the first and second read signals as an analog signal and convert the analog signal into a digital signal. In order to do so, the offset line shown in FIG. 10 is swept over a given range to measure the timing at which the output SAOUT is inverted.

At this time, the sensing circuit serves as an AD converter rather than as a binary sensing circuit.

<3. Second Embodiment>

Figure 12:
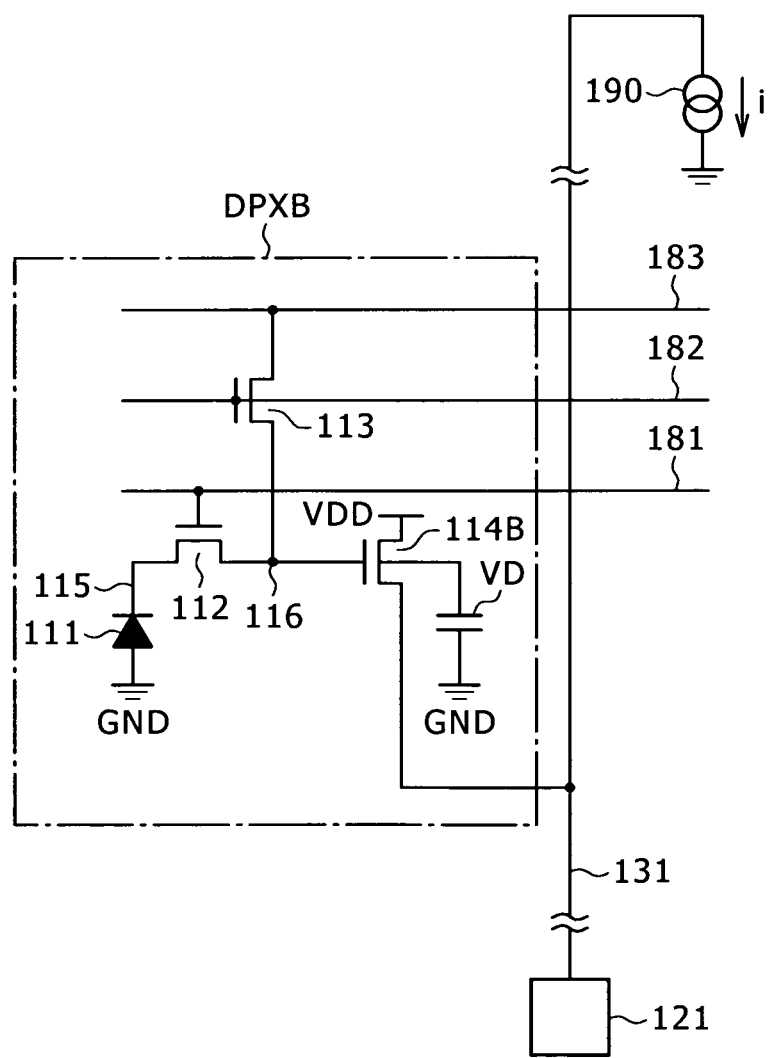
FIG. 12 is a diagram illustrating an example of a pixel circuit configuration according to a second embodiment.

FIG. 12 is a diagram illustrating an example of a pixel circuit configuration according to a present second embodiment.

A unit pixel 11C according to the present second embodiment differs from a unit pixel A according to the first embodiment in that an amplifying transistor 114B is formed with an NMOS transistor that is an n-type FET rather than a p-type FET (PMOS transistor).

The amplifying transistor 114B has its drain connected to the source potential VDD and its source connected to the output signal line 131.

In the present second embodiment, the amplifying NMOS transistor 114B has its NMOS substrate in a floating state because of its SOI (Silicon on Insulator) structure.

In a single unit pixel DPXB, photons incident upon the silicon substrate of the pixel generate electron-hole pairs. The electrons in these pairs are stored in the storage node 115 by the photodiode 111.

The electrons are transferred to the FD node 116 as the transfer NMOS transistor 112 is turned on at a given timing, thus driving the gate of the amplifying NMOS transistor 114B.

On the other hand, the reset NMOS transistor 113 drives a control line 183 connected to its drain, thus discharging the electrons from the photodiode 111 and resetting the pixel. When the pixel is not selected, the reset NMOS transistor 113 turns off the amplifying NMOS transistor 114B, thus isolating the pixel from the output signal line 131.

The amplifying NMOS transistor 114B has its drain connected to the source potential VDD and its source connected to the output signal line 131 as a pixel output.

Here, the amplifying NMOS transistor 114B has an SOI structure. The substrate thereof is in a floating state with an extremely small parasitic capacitance VD.

In a transistor such as the amplifying transistor 114B, the channel is completely depleted. As a result, the substrate potential of the SOI substrate 232 changes with change in the source potential, thus suppressing the substrate bias effect and bringing the gain closer to one.

This provides significantly smaller effective gate capacitance of the amplifying NMOS transistor 114B.

The output signal line 131 is shared among the plurality of pixels arranged side by side in the row direction and connected to the ground GND via the constant-current circuit 190. This allows for the amplifying NMOS transistor 114B to act as a source follower.

That is, the signal charge transferred to the FD node 116 is output as a signal to the output signal line 131.

Figure 13:
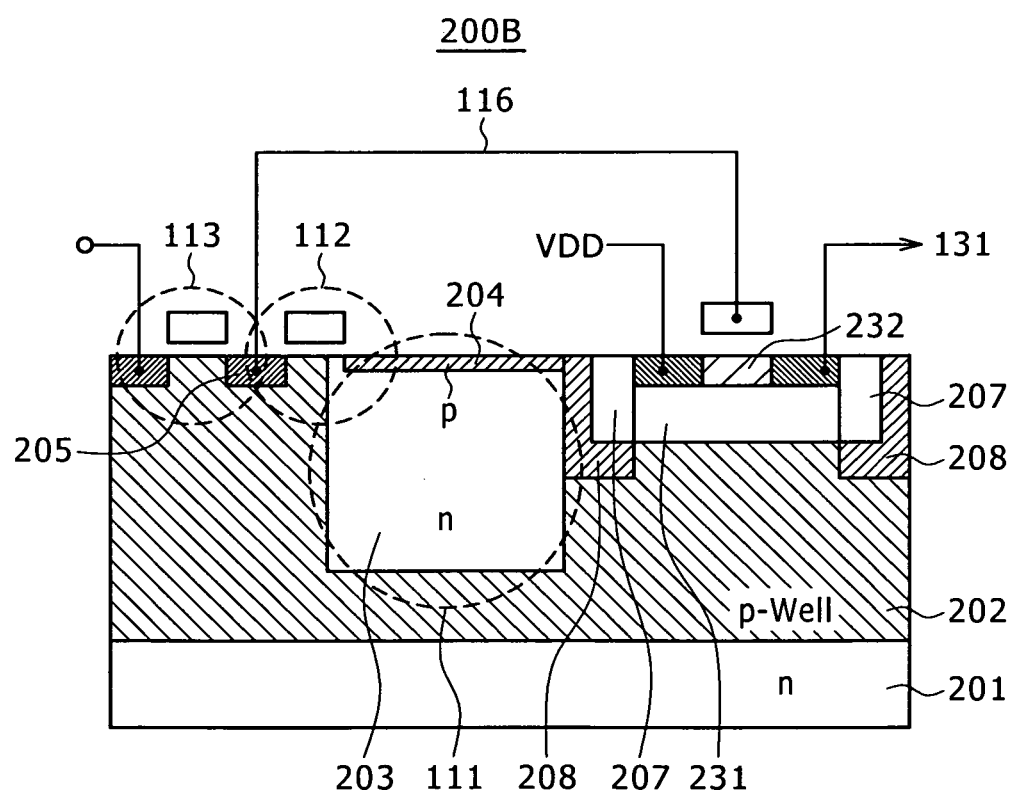
FIG. 13 is a diagram illustrating an example of sectional structure of the pixel circuit according to the second embodiment.

FIG. 13 is a diagram illustrating an example of sectional structure of the pixel circuit according to the present second embodiment.

In a pixel circuit 200B shown in FIG. 13, the p-Well region 202 is formed on the thin n-type layer 201, and the elements making up the pixel are formed in the p-Well region 202, as with the first embodiment shown in FIG. 5.

In the photodiode 111, the p-type layer 204 is formed on the surface of the n-type storage layer 203. As a result, the photodiode 111 is a so-called "buried photodiode."

The transfer transistor 112 is an NMOS transistor using the p-Well 202 of substrate 210. The transfer transistor 112 transfers the charge stored in the photodiode 111 to the FD node.

The amplifying transistor 114B is an NMOS transistor using an SOI layer 232, electrically isolated from the p-Well 202 by an oxide insulating film 231, as its substrate.

The oxide insulating film 231 is formed, for example, by injecting oxygen ions into the substrate followed by thermal treatment. The amplifying transistor 114 has its drain connected to the power source and its source forming a pixel output.

Further, the reset NMOS transistor 113 is formed in the pixel circuit 200A. The reset NMOS transistor 113 uses the p-Well 202 as its substrate. The reset NMOS transistor 113 has its drain 113D driven by a peripheral circuit depending on whether or not the pixel is selected.

The buried oxide film 207 isolates an SOI layer 132 from the p-Well substrate 202 together with the oxide insulating film 231. The buried oxide film 207 is covered with the high-concentration p-type layer 208 on the bottom and side.

As a result, the SOI layer 232 is in a floating state. Because the parasitic capacitance thereof is extremely small, the potential of the SOI layer 232 changes with change in the source output.

This provides significantly smaller effective gate capacitance of the amplifying NMOS transistor 114B, thus contributing to significantly reduced effective parasitic capacitance of the FD node 116.

It should be noted that an SOI transistor used for the amplifying transistor 114B may be available in various structures and manufactured by various manufacturing methods.

That is, so long as the SOI transistor is isolated from the p-Well 202, serving as the substrate of the photodiode 111 and transfer transistor 112, by an insulating film, with the substrate in a floating state, the SOI transistor is applicable to the present invention regardless of its structure and manufacturing method.

<4. Third Embodiment>

Figure 14:
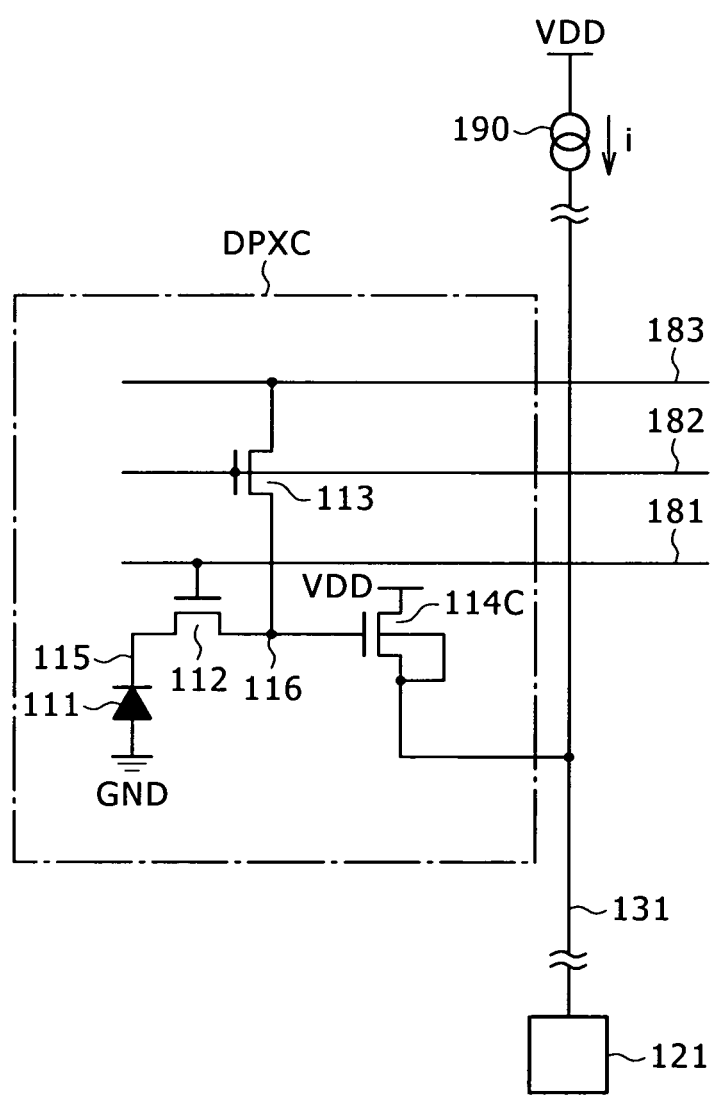
FIG. 14 is a diagram illustrating an example of a pixel circuit configuration according to a third embodiment.

FIG. 14 is a diagram illustrating an example of a pixel circuit configuration according to a present third embodiment.

A unit pixel DPXC according to the present third embodiment differs from the unit pixel DPXA according to the first embodiment in that an amplifying transistor 114C is formed with an NMOS transistor that is an n-type FET rather than a p-type FET (PMOS transistor).

The amplifying NMOS transistor 114C has its drain connected to the source potential VDD and its source connected to the output signal line 131.

Even with the amplifying NMOS transistor 114C, the substrate thereof is electrically isolated from the substrate of other elements and connected to the output signal line 131 on the output side of the source follower.

Further, the reset NMOS transistor 113 has its drain connected to the control line 183.

The third embodiment provides the same advantageous effects as the first embodiment.

<5. Fourth Embodiment>

Figure 15:
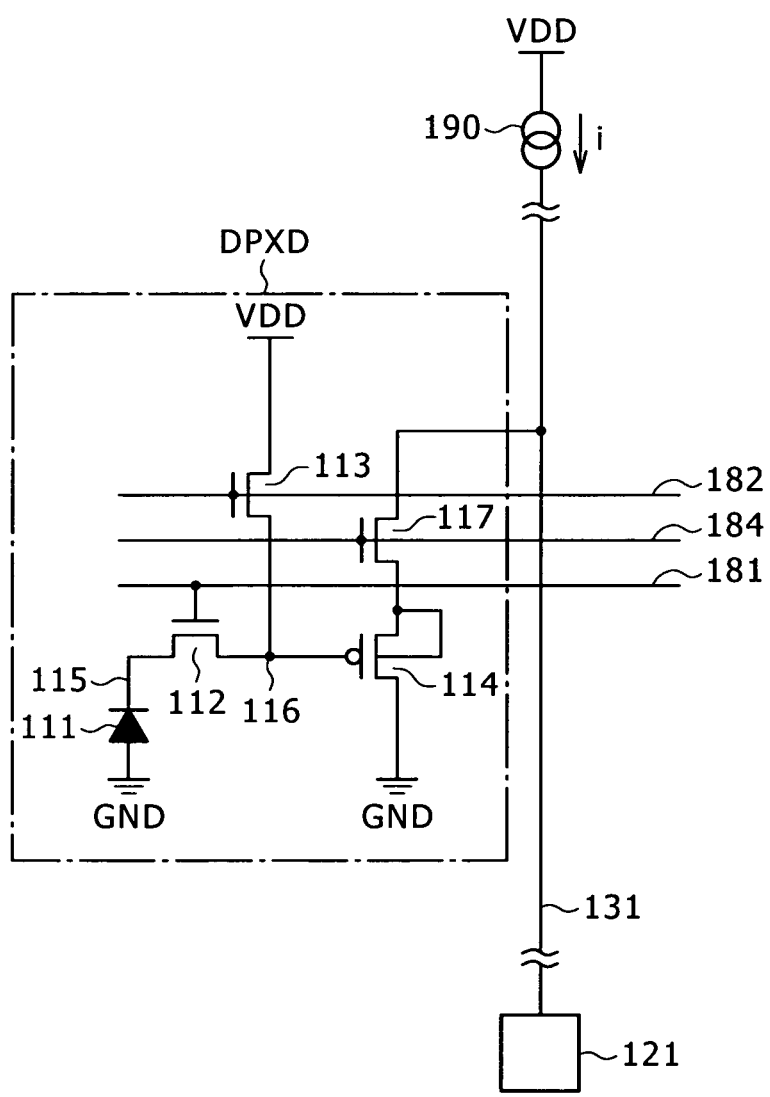
FIG. 15 is a diagram illustrating an example of a pixel circuit configuration according to a fourth embodiment.

FIG. 15 is a diagram illustrating an example of a pixel circuit configuration according to a fourth embodiment.

A unit pixel DPXD according to the present fourth embodiment differs from the unit pixel DPXA according to the first embodiment in that a select transistor 117 is added between the amplifying transistor 114 and output signal line 131.

The select transistor 117 has its gate connected to a select line 184.

This addition of a select transistor is advantageous in that it can isolate the unselected pixel from the output signal line 131, thus providing reduced capacitive load thereof.

It should be noted that the above-described imaging elements according to the first to fourth embodiments are applicable as imaging devices for use in digital cameras and video camcorders.

<6. Fifth Embodiment>

Figure 16:
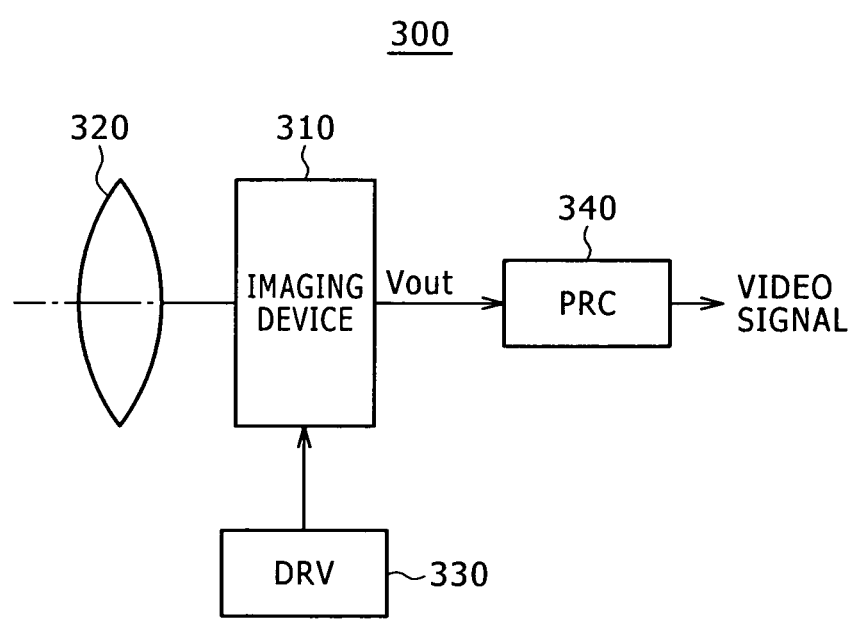
FIG. 16 is a diagram illustrating an example of a camera system to which the solid-state imaging element according to the embodiments of the present invention is applied.

FIG. 16 is a diagram illustrating an example of a camera system to which the imaging element according to the embodiments of the present invention is applied.

As illustrated in FIG. 16, a present camera system 300 includes an imaging device 310 to which the CMOS image sensor (imaging element) 100 according to the present embodiments is applicable.

The camera system 300 includes an optics designed to guide incident light to the pixel region of the imaging device 310 (form a subject image) such as a lens 320 adapted to focus incident light (image light) on the imaging surface so as to form an image.

Further, the camera system 300 includes a drive circuit (DRV) 330 and signal processor (PRC) 340. The drive circuit 330 drives the imaging device 310. The signal processor 340 processes a signal output from the imaging device 310.

The drive circuit 330 includes a timing generator (not shown) adapted to generate a variety of timing signals such as start and clock pulses used to drive the circuits provided in the imaging device 310, thus driving the imaging device 310 at a given timing.

Further, the signal processor 340 processes a given signal process on the output signal from the imaging device 310.

On the other hand, an image signal processed by the signal processor 340 is recorded on a recording medium such as memory. Imaging information recorded on a recording medium is hard-copied, for example, by a printer. Further, an image signal processed by the signal processor 340 is displayed as a moving image on a liquid crystal display or other type of monitor.

As described earlier, incorporating the above-described imaging element 100 as the imaging device 310 in an imaging apparatus such as digital still camera provides a high-accuracy camera with low power consumption.

Incidentally, the configuration shown in FIG. 1 in which one sensing circuit is shared among a plurality of pixels is required when the pixels and sensing circuits are arranged on the same semiconductor substrate. In recent years, however, new techniques using wafer bonding have come along that are designed to provide multiple semiconductor layers.

In such a case, there may be an option to arrange sensing circuits for pixels on the underlying layer of the pixels.

Even in this case, the pixels can be readily added by having an integrated circuit made up of a counter and other circuits shared by a plurality of sensing circuits, thus providing improved imaging dynamic range.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging element comprising:
   a photodiode extending into a first well region from a surface of a semiconductor substrate, said photodiode being between a floating diffusion region and a buried insulation film;
   an amplifying transistor drain extending into a second well region from said surface of the semiconductor substrate, said buried insulation film being adjacent to said second well region;
   an amplifying transistor source extending into said second well region from said surface of the semiconductor substrate, an amplifying transistor channel region being between said amplifying transistor drain and said amplifying transistor source;
   an amplifying transistor gate electrode directly electrically connected to said floating diffusion region, said surface of the semiconductor substrate being between said amplifying transistor channel region and said amplifying transistor gate electrode.

2. The imaging element of claim 1, wherein said amplifying transistor gate electrode in a layout is between said amplifying transistor drain and an amplifying transistor source.

3. The imaging element of claim 2, wherein said buried insulation film in said layout is between said photodiode and another photodiode.

4. The imaging element of claim 2, wherein said buried insulation film in said layout surrounds said amplifying transistor source and said amplifying transistor drain.

5. The imaging element of claim 2, wherein a reset transistor gate electrode in said layout is between said floating diffusion region and said reset transistor drain.

6. The imaging element of claim 5, wherein said buried insulation film in said layout is between said amplifying transistor drain and said reset transistor gate electrode.

7. The imaging element of claim 1, wherein a signal charge is transferable from said photodiode to said floating diffusion region, said signal charge being transferable from said floating diffusion region to said amplifying transistor gate electrode.

8. The imaging element of claim 1, wherein a photon incident upon said photodiode is converted into a signal charge, a presence or absence of the photon upon said photodiode being output from said amplifying transistor source as an electric signal.

9. The imaging element of claim 8, wherein a sensing circuit receives said electric signal, a determination result compilation circuit section counting a presence of the photon during a time period.

10. The imaging element of claim 9, further comprising:
    a constant-current circuit directly electrically connected to said sensing circuit and said amplifying transistor source.

11. The imaging element of claim 10, further comprising:
    a contact region within said second well region, a connection directly electrically connecting said amplifying transistor source to said contact region and said constant-current circuit.

12. The imaging element of claim 1, wherein said second well region is of a conductivity type opposite to said first well region.

13. The imaging element of claim 1, wherein said first well region and said second well region are of a same conductivity type.

14. The imaging element of claim 1, wherein said floating diffusion region is between a reset transistor drain and said photodiode, said floating diffusion region extending into said first well region from said surface of the semiconductor substrate.

15. The imaging element of claim 1, further comprising:
an insulating film, said second well region being between said amplifying transistor gate electrode and said insulating film.

16. The imaging element of claim 15, wherein said insulation film touches said second well region and said insulating buried film.

17. The imaging element of claim 15, wherein said insulating film is an oxide.

18. The imaging element of claim 1, wherein said buried insulation film is a buried oxide.

19. The imaging element of claim 1, wherein said buried insulation film is within said first well region.

20. The imaging element of claim 1, wherein said photodiode is electrically isolated from said second well region.

21. The imaging element of claim 1, wherein said amplifying transistor gate electrode is electrically isolated from said second well region.

22. The imaging element of claim 1, wherein said reset transistor drain is within said first well region.

23. The imaging element of claim 1, wherein said amplifying transistor drain is fixed at a reference potential.

24. The imaging element of claim 1, wherein a photo-receiving layer of said photodiode is within a storage layer of said photodiode, said storage layer being of a conductivity type opposite to said photo-receiving layer.

25. The imaging element of claim 24, wherein said photo-receiving layer is between said storage layer and said surface of the semiconductor substrate.

26. The imaging element of claim 24, wherein said surface of the semiconductor substrate is between a transfer transistor gate electrode and a portion of the storage layer.

27. The imaging element of claim 26, wherein said portion of the storage layer is between said photo-receiving layer and said floating diffusion region.

28. The imaging element of claim 24, further comprising:
a high-concentration layer between said buried insulation film and said storage layer, said storage layer and said buried insulation film touching said high-concentration layer.

29. The imaging element of claim 28, wherein said buried insulation film is between said high-concentration layer and said second well region.

30. The imaging element of claim 28, wherein said high-concentration layer is between said photo-receiving layer and said buried insulation film.

31. The imaging element of claim 28, wherein said photo-receiving layer and said high-concentration layer are of a same conductivity type, said storage layer being of a conductivity type opposite to said first well region.

32. The imaging element of claim 28, wherein said high-concentration layer touches said storage layer and said photo-receiving layer.

33. The imaging element of claim 32, wherein said high-concentration layer touches said buried insulation film and said first well region.

34. The imaging element of claim 1, wherein said buried insulation film is between said photodiode and said amplifying transistor drain.

35. The imaging element of claim 1, wherein said reference potential is ground.

36. The imaging element of claim 1, wherein said amplifying transistor channel region and said second well region are of a same conductivity type.

37. The imaging element of claim 1, wherein said first well region is P-type.

38. An imaging element comprising:
a photodiode extending into a first well region from a surface of a semiconductor substrate, said photodiode being between a floating diffusion region and a buried insulation film;
an amplifying transistor drain extending into a second well region from said surface of the semiconductor substrate, said buried insulation film being between said photodiode and said amplifying transistor drain;
an amplifying transistor source extending into a second well region from said surface of the semiconductor substrate, an amplifying transistor channel region being between said amplifying transistor drain and said amplifying transistor source;
an amplifying transistor gate electrode directly electrically connected to said floating diffusion region, said surface of the semiconductor substrate being between said amplifying transistor channel region and said amplifying transistor gate electrode,
wherein said amplifying transistor drain is fixed at a reference potential,
wherein said reference potential is ground.

39. A camera system comprising:
optics configured to guide incident light onto the imaging element of claim 1, said imaging element outputting an image signal;
a signal processor configured to process said image signal, said image signal upon processing becoming a video signal.

* * * * *